United States Patent
Koyama et al.

(10) Patent No.: US 7,278,725 B2
(45) Date of Patent: Oct. 9, 2007

(54) LAYER FORMING METHOD, LAYER FORMING APPARATUS, DEVICE, MANUFACTURING METHOD FOR DEVICE, AND ELECTRONIC APPARATUS

(75) Inventors: Minoru Koyama, Matsumoto (JP); Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/400,526

(22) Filed: Mar. 28, 2003

(65) Prior Publication Data

US 2003/0198789 A1 Oct. 23, 2003

(30) Foreign Application Priority Data

Apr. 19, 2002 (JP) .............................. 2002-118295
Mar. 19, 2003 (JP) .............................. 2003-076109

(51) Int. Cl.
*G01D 11/00* (2006.01)
*B41J 2/01* (2006.01)

(52) U.S. Cl. .................. 347/100; 347/105; 347/43; 428/32.1

(58) Field of Classification Search ................ 347/12, 347/15, 41, 43, 105, 101, 96, 100, 19, 95, 347/40, 107, 102, 44, 45, 47, 54; 428/195, 428/32.1; 106/31.13, 31.27, 31.6; 523/160; 427/466, 96

See application file for complete search history.

(56) References Cited

U.S. PATENT DOCUMENTS

| | | | | |
|---|---|---|---|---|
| 4,752,784 A | * | 6/1988 | Saito et al. | 347/55 |
| 5,726,690 A | * | 3/1998 | Bohorquez et al. | 347/15 |
| 6,371,588 B1 | * | 4/2002 | Tsuruoka | 347/12 |
| 6,378,999 B1 | * | 4/2002 | Doi et al. | 347/100 |
| 6,582,048 B1 | * | 6/2003 | Akahira et al. | 347/19 |
| 6,599,582 B2 | * | 7/2003 | Kiguchi et al. | 427/466 |
| 2004/0135845 A1 | * | 7/2004 | Mantell | 347/43 |

FOREIGN PATENT DOCUMENTS

| | | |
|---|---|---|
| JP | A-55-113573 | 8/1980 |
| JP | A-09-320363 | 12/1997 |
| JP | A 10-151773 | 6/1998 |
| JP | A-10-315450 | 12/1998 |
| JP | A 11-274671 | 10/1999 |
| JP | B2-3015208 | 12/1999 |
| JP | A-2000-089019 | 3/2000 |
| JP | A 2000-135467 | 5/2000 |
| JP | A 2000-211166 | 8/2000 |
| JP | A 2000-216330 | 8/2000 |

\* cited by examiner

*Primary Examiner*—Manish S. Shah
(74) *Attorney, Agent, or Firm*—Oliff & Berridge, PLC (57) ABSTRACT

A plurality of unit areas (bit) B are set on a base board. A liquid drop made of a liquid member is ejected to the unit area B from a liquid drop ejecting head so as to form a layer on the base board. A first pattern is formed by a first nozzle group Na in nozzles N which are formed in the liquid drop ejecting head. A second pattern is formed by a second nozzle group Nb which is different from the first nozzle group Na. By doing this, it is possible to maintain a stable ejection operation so as to form a pattern in preferable accuracy when patterns having different features are formed on the base board by using the liquid drop ejecting apparatus.

8 Claims, 9 Drawing Sheets

LAYER FORMING METHOD, LAYER FORMING APPARATUS, DEVICE, MANUFACTURING METHOD FOR DEVICE, AND ELECTRONIC APPARATUS

BACKGROUND OF THE INVENTION

1. Field of the Invention

The present invention relates to a layer forming method which uses a liquid drop ejecting device and a layer forming apparatus, device and manufacturing method therefor, and an electronic apparatus.

2. Description of Related Art

Conventionally, a photo-lithography method has been commonly used for manufacturing a fine wiring pattern for a semiconductor-integrated-circuit. Recently, methods using a liquid drop ejecting method are disclosed. According to such a method, a liquid member which contains a pattern forming member is ejected to a base board from a liquid drop ejecting head; thus a wiring pattern is formed by disposing the pattern forming member on a pattern forming surface. It is understood that such technique is quite effective for multi-product production in a small volume (See Japanese Unexamined Patent Application, First Publication, No. Hei 11-274671 and Japanese Unexamined Patent Application, First Publication, No. 2000-216330 for reference).

Here, when a wiring pattern is formed on a device, there is a case in which, for example, a linear line pattern and an inclining line pattern which is diagonal to the linear line pattern exist together, or a wiring pattern has different line widths co-existing. However, when these different wiring patterns are formed by a liquid drop ejecting apparatus under a common ejection conditions, there have sometimes been cases in which a required accuracy cannot be obtained in the formed pattern.

For example, when a wiring pattern in which a liner line pattern and an inclining line pattern exist together is formed under common ejection conditions in which liquid drops having a common size are ejected, it occurs that intervals of the ejected liquid drops do not continue, particularly in an inclining line pattern; therefore, the obtained wiring pattern may have a conductivity defect. Thus, there is a concern that device quality may be degraded.

SUMMARY OF THE INVENTION

The present invention was made in consideration of the above problems. An object of the present invention is to provide a layer manufacturing apparatus and method therefor by which it is possible to maintain a stable ejection operation so as to form a pattern with a preferred accuracy when patterns are formed on a base board by a liquid drop ejecting apparatus such that different patterns coexist. Another object of the present invention is to provide a device and an electronic apparatus using a layer manufactured by the above products.

In order to solve the above problems, a layer forming method for setting a plurality of unit areas on a base board and ejecting a liquid drop made from a liquid member from a liquid drop ejecting head to the unit area and forming a layer on the base board preferably comprises steps of forming a first pattern by a first nozzle group which are formed in the liquid drop ejecting head, and forming a second pattern by a second nozzle group which is different from the first nozzle group.

According to the present layer forming method, a first pattern is formed by a first nozzle group and a second pattern is formed by a second nozzle group which is different from the first nozzle group. Therefore, even if intervals between the liquid drops are insufficient when linear line patterns and inclining line patterns are formed by, for example, the first nozzle group and the liquid drop is ejected only to a unit area in the linear line pattern, the liquid drops are ejected to a border section in the unit area by the second nozzle group so as to be between the liquid drops in the linear line pattern formed by the liquid drops which are ejected by the first nozzle group. Therefore, the intervals of the liquid drops are formed continuously in the linear line pattern.

Also, in the layer forming method of the present invention, it is preferable that the liquid drop be ejected to the unit area by the first nozzle group, and that the liquid drop be ejected to a border section in the unit areas by the second nozzle group.

By doing this, a layer (pattern) is formed by the continuous liquid drops; thus, the obtained layer (pattern) has superior continuity.

Also, in the layer forming method according to the present invention, it is preferable that the liquid member contain a conductive member.

By doing this, it is possible to form a conductive layer such as a wiring pattern. Therefore, it is possible to form a wiring pattern having superior continuity which is free of line discontinuities.

Also, in the layer forming method according to the present invention, it is preferable that the first nozzle group and the second nozzle group be disposed in a staggered manner in the liquid drop ejecting head.

When the intervals between nozzles in the first nozzle group is made to correspond to the intervals between the neighboring unit areas, the liquid drop ejecting head is inclined. This is because the intervals between the nozzles in the first nozzle group are usually wider, and the interval between the nozzles in the first nozzle group ostensibly should preferably be narrowed. In such a case, if the first nozzle group and the second nozzle group are disposed in a staggered manner, it is possible to use relatively small inclination angle of the liquid drop ejecting head because the intervals between the nozzles in the first nozzle group are initially narrow.

In a layer forming method according to the present invention, it is preferable that an interval between the nozzles be determined according to an interval between the unit areas in the liquid drop ejecting head.

According to the layer forming method in the present invention, the liquid drop is ejected without controlling the inclination angle θ of the liquid drop ejecting head. Therefore, an inclination angle adjusting device is not necessary in the layer forming apparatus because the liquid drop is ejected from the a certain liquid drop ejecting head in the layer forming device. Thus, the inclination angle adjusting device is not necessary; thus, it is possible to reduce the cost of the layer forming apparatus.

In a layer forming apparatus for setting a plurality of unit areas on a base board and ejecting a liquid drop made from a liquid member from a liquid drop ejecting head to the unit area and forming a layer on the base board according to the present invention, it is preferable that the layer forming apparatus be provided with a controlling section for controlling an ejection operation of a liquid drop ejection head which forms a first pattern by a first nozzle group of the nozzles which are formed on a liquid drop ejecting head and forms a second pattern by a second nozzle group which is different from the first nozzle group.

The present layer forming apparatus is provided with a controlling section which controls an ejection operation of the liquid drop ejection head such that a first pattern is formed by a first nozzle group and a second pattern is formed by a second nozzle group which is different from the first nozzle group. Therefore, even if intervals between the liquid drops are insufficient when linear line patterns and inclining line patterns are formed by, for example, the first nozzle group, and the liquid drop is ejected only to a unit area in the linear line pattern, the liquid drops are ejected to a border section in the unit area by the second nozzle group so as to be between the liquid drops in the linear line pattern formed by the liquid drops which are ejected by the first nozzle group. Therefore, the intervals of the liquid drops are formed continuously in the linear line pattern.

Also, in a layer forming apparatus according to the present invention, it is preferable that a liquid drop ejecting device be provided with an inclination controlling device for controlling the angle of inclination of the liquid drop ejection head.

By doing this, the inclination angle of the liquid drop ejecting head is controlled by the inclination angle adjusting device; thus, it is possible to easily make the intervals of the nozzles correspond to the interval between the neighboring unit areas.

Also, in the layer forming apparatus according to the present invention, it is preferable that the liquid drop ejecting device be provided with an ejection quantity adjusting section for adjusting the liquid drop ejection quantity from nozzles in the liquid drop ejecting head.

By doing this, the ejection quantity of the liquid drop from each nozzle on the liquid drop ejecting head is adjusted by the ejection quantity adjusting section; thus, it is possible to adjust the thickness of a formed layer or width in the pattern. In particular, it is possible to enhance the patterning accuracy.

It is preferable that a device according to the present invention have a layer which is formed by the layer forming apparatus of the present invention.

By doing this, the device has a superior continuity in the layer (pattern).

It is preferable that the manufacturing method according to the present invention for a device which is manufactured by setting a plurality of unit areas on a base board and ejecting a liquid drop made from a liquid member from a liquid drop ejecting head to the unit area and forming a layer on the base board comprises steps of forming a first pattern by a first nozzle group which is formed by the liquid drop ejecting head, forming a second pattern by a second nozzle group which is different from the first nozzle group and forming the layer on the base board.

According to the manufacturing method for a device in the present invention, it is possible to manufacture a device which has a layer (pattern) with superior continuity.

It is preferable that an electronic apparatus in the present invention be provided with a device according to the present invention.

By doing this, the device in the present invention has superior device quality.

As explained above, according to the present invention, the first pattern is formed by the first nozzle group and the second pattern is formed by the second nozzle group which is different from the first nozzle group. Therefore, even if intervals between the liquid drops are insufficient when linear line patterns and inclining line pattern are formed by, for example, the first nozzle group and the liquid drop is ejected only to a unit area in the inclining line pattern, the liquid drops are ejected to a border section in the unit area by the second nozzle group so as to be between the liquid drops in the inclining line pattern formed by the liquid drops which are ejected by the first nozzle group. Therefore, it is possible to form a continuous layer (pattern); thus, the obtained layer (pattern) has a superior continuity. By doing this, it is possible to increase the product yield and maintain the stable ejection operation; thus, it is possible to manufacture a high quality device.

BRIEF DESCRIPTION OF THE DRAWINGS

FIGS. 2A and 2B show a general structure of a liquid drop ejecting head.

FIGS. 8A and 8B show a liquid crystal display device in which the layer forming method according to the present invention is employed.

FIGS. 9A to 9C show an electric field emission display in which the layer forming method according to the present invention is employed.

FIGS. 10A to 10C show examples of an electronic apparatus.

DETAILED DESCRIPTION OF THE INVENTION

The present invention is explained in detail below.

Figure 1:
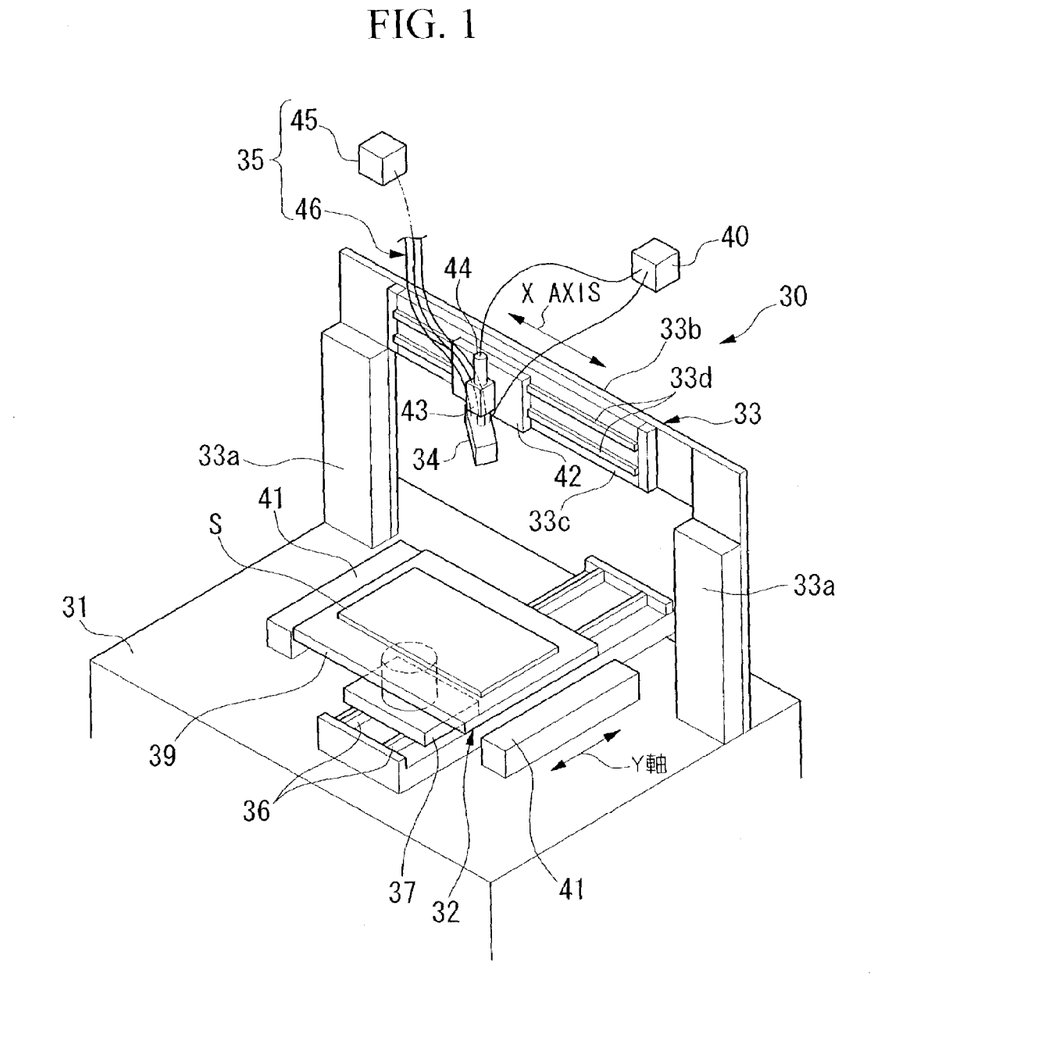
FIG. 1 is a perspective view showing a general structure of an example of a layer forming apparatus according to the present invention.

FIG. 1 shows an example of the layer forming apparatus according to the present invention. Reference numeral 30 in FIG. 1 indicates a layer forming apparatus. The layer forming apparatus 30 is provided with a base 31, a base board handling section 32, a head moving section 33, a liquid drop ejecting head 34, a liquid supplying section 35, and a controlling section 40 and the like. The base board handling section 32 and the head moving section 33 are provided on the base 31. The base board handling section 32 is provided on the base 31. The base board handing section 32 is provided with a guide rail 36 which is disposed in a Y-axis direction. The base board handling section 32 moves a slider 37 along the guide rail 36 by, for example, a linear motor (not shown in the drawing).

A stage 39 is fixed on the slider 37. The stage 39 sets and retains a base board S in a predetermined position. That is, the stage 39 has an absorbing retaining section (not shown in the drawing) which is commonly known. The stage 39 operates the absorbing retaining section; thus, the stage 39 absorbs and retains the base board S on the stage 39. The base board S is positioned and retained in a predetermined position on the stage 39 accurately by, for example, a positioning pin (not shown in the drawing) on the stage 39.

A flushing area 41 for the liquid drop ejecting head for flushing is provided on both sides of the base board S on the stage 39, in other words, on both sides in a moving direction (X-axis direction) of the liquid drop ejecting head 34.

The head moving section 33 comprises a pair of columns 33a and 33a, which stands in a rear end of the stage 31 and a runway 33b which is provided above the columns 33a and 33a. In the head moving section 33, the runway 33b is disposed in the X-axis direction which is orthogonal to the Y-axis in which the base board handling section 32 moves. The runway 33b is formed by a retaining board 33c which is disposed on the columns 33a and 33a, and a pair of guide rails 33d and 33d. A carriage 42 for carrying the liquid drop ejecting head 34 in a longitudinal direction of the guide rails 33d and 33d is retained so as to freely move in the head moving section 33. The carriage 42 runs on the guide rails 33d and 33d by a linear motor (not shown in the drawing) or the like. By doing this, the liquid drop ejecting head 34 moves in the X-axis direction. Here, the carriage 42 can move in a longitudinal direction of the guide rails 33d and 33d, in other words, in the X-axis direction by, for example, every 1 μm. Such a movement is controlled by the controlling section 40.

The liquid drop ejecting head 34 is attached to the carriage 42 so as to freely rotate via an attaching section 43. A motor 44 is disposed on the attaching section 43. A supporting shaft (not shown in the drawing) of the liquid drop ejecting head 34 is connected to the motor 44. By doing this, the liquid drop ejecting head 34 can rotate in its circular direction. Also, the motor 44 is connected to the controlling section 40. By doing this, the rotating angle of the liquid drop ejecting head 34 in its circular direction such as the inclination angle of the liquid drop ejecting head is controlled by the controlling section 40. An inclination angle controlling device (not shown in the drawing) according to the present invention is formed by the motor 44, the supporting shaft which supports the liquid drop ejecting head 34, and the controlling section 40 in the above structure.

Figure 2A:
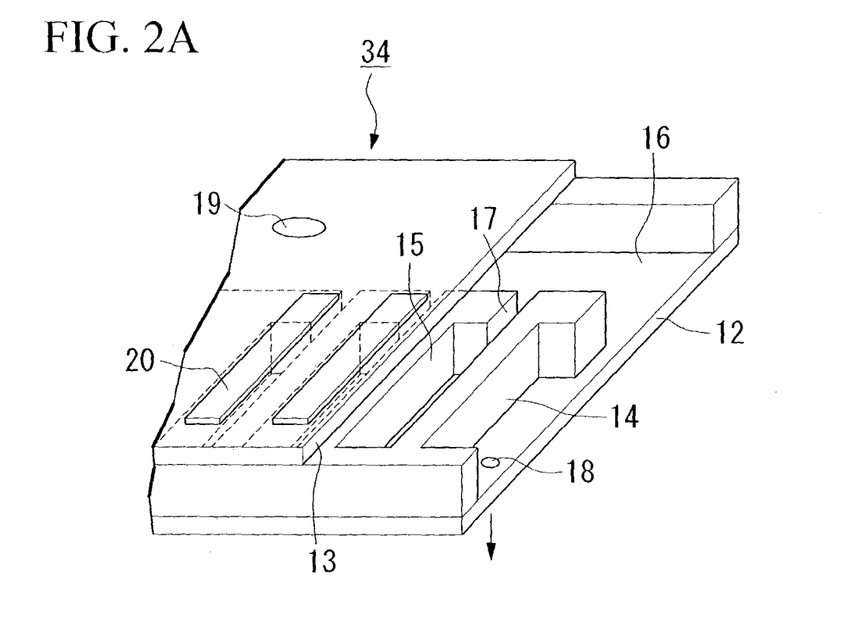
FIG. 2A is a perspective view for showing an important part of the liquid drop ejecting head.

Here, the liquid drop ejecting head 34 is provided with a nozzle plate 12 and a vibrating plate 13, both of which are of stainless steel, as shown in FIG. 2A. The nozzle plate 12 and the vibrating plate 13 are attached together via a separating member (reservoir plate) 14. A plurality of spaces 15 and a liquid pool 16 are formed between the nozzle plate 12 and the vibrating plate 13 by the separating member 14. Each space 15 and liquid pool 16 is filled with a liquid member. Each space 15 and liquid pool 16 communicate via a supply port 17. A plurality of nozzle holes 18 for ejecting the liquid member from the spaces 15 are formed in the nozzle plate in a regular manner horizontally and vertically. A hole 19 for supplying the liquid member to the liquid pool 16 is formed on the vibrating plate 13.

Figure 2B:
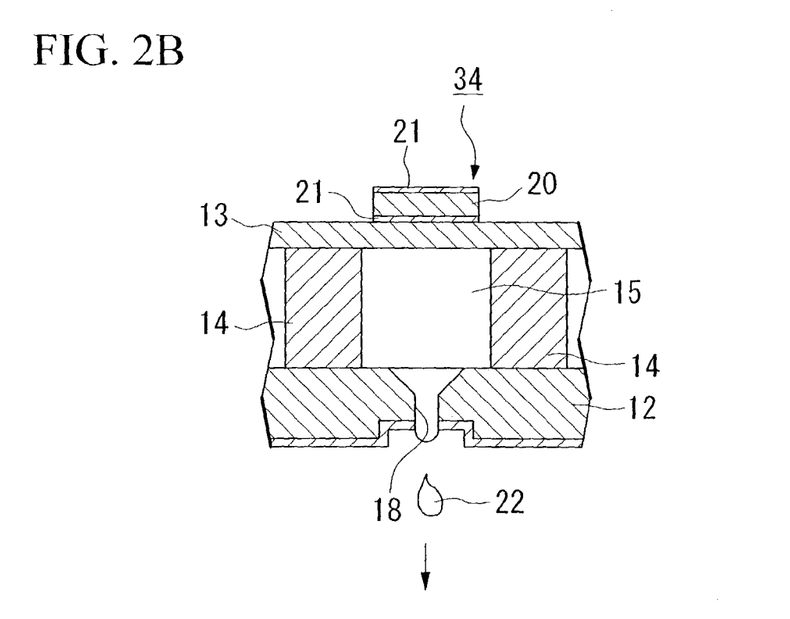
FIG. 2B is a bottom view of the liquid drop ejecting head.

Also, a piezoelectric element (piezo-element) 20 is attached on a surface of the vibrating plate 13 so as to be directed opposite to the space 15 as shown in FIG. 2B. The piezoelectric element 20 is disposed between a pair of electrodes 21. When electricity is applied to the piezoelectric element 20, the piezoelectric element 20 bends so as to protrude thereoutside. The vibrating plate 13 to which the piezoelectric element 20 is attached bends so as to protrude thereoutside together with the piezoelectric element 20. By doing this, the volume of the space 15 increases. Therefore, the liquid member having a volume which is equivalent to the increased volume in the space flows into the space 15 from the liquid pool 16 via the supplying port 17. Also, when the electricity is turned off to the piezoelectric element 20, the piezoelectric element 20 and the vibrating plate 13 return to their in initial shapes. Therefore, the volume in the space 15 returns to initial conditions. Thus, a pressure in the liquid member inside the space 15 increases; therefore, a liquid drop 22 is ejected from the nozzle hole 18 toward a base board.

Figure 3:
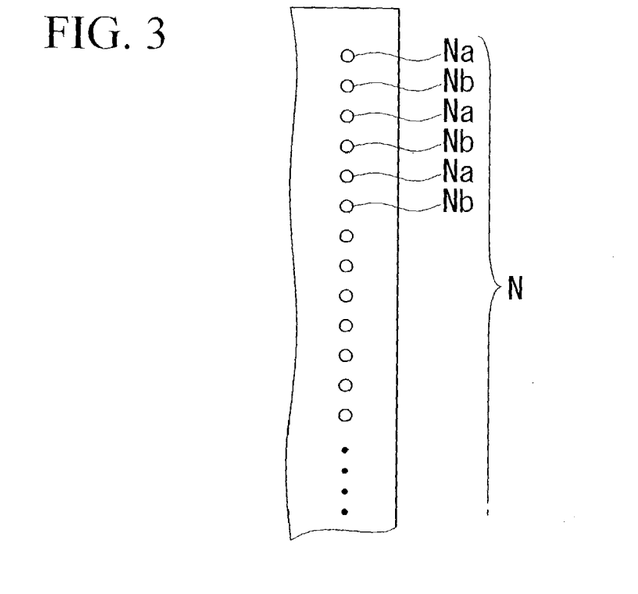
FIG. 3 is a bottom view of the liquid drop ejecting head for explaining disposition of the nozzles in the liquid drop ejecting head.

Here, a bottom shape of the liquid drop ejecting head 34 having the above structure is approximately a rectangle. Nozzles N (nozzle holes 18) are disposed in an equal interval vertically in a rectangular manner in the liquid drop ejecting head 34. In the present embodiment, nozzles which are disposed so as to have one sub-nozzle Nb (second nozzle) therebetween are called main nozzles (first nozzles) Na in a nozzle array which is disposed in the vertical longitudinal direction. Also, the sub-nozzles are disposed so as to have one main nozzle (first nozzle) Na therebetween.

Nozzles N (nozzle Na, nozzle Nb) are provided with piezoelectric elements 20 respectively. By doing this, the ejection operation can be performed independently. That is, by controlling an ejection waveform as an electric signal which is sent to the piezoelectric element 20, it is possible to adjust and change the ejection amount of the liquid drop from nozzles N. Here, the controlling section 40 controls the ejection waveform. In this way, the controlling section 40 can work as an ejection amount adjusting section for adjusting the ejection amount of the liquid drop from nozzles N.

Here, the liquid drop ejecting head 34 is not limited to a piezo-jet liquid drop ejecting head which uses the piezoelectric element 20 as described above. For example, a liquid drop ejecting head according to a thermal method can be used. In such a case, it is possible to change the ejecting amount of the liquid drop by changing the duration of the application of electricity.

A liquid member supplying section 35 comprises a liquid member supplying source 45 for supplying a liquid member to the liquid drop ejecting head 34 and a liquid member supplying tube 46 for supplying a liquid member to the liquid drop ejecting head 34 from the liquid member supplying source 45. A liquid member is not limited to any particular liquid product; thus, it is possible to use various liquid products according to the requirement for a layer which is supposed to be formed. For example, when a formed layer is used for a wiring pattern, a liquid member which contains the following conductive particle is used. Here, it is acceptable that the liquid member containing an insulating particle be ejected from the liquid drop ejecting head so as to form an insulating pattern according to the requirement for the formed layer.

For the liquid member which contains a conductive particle, a dispersion liquid in which a conductive particle is dispersed in a dispersion medium can be used. As such a conductive particle, a metal particle containing any one of gold, silver, copper, palladium, and nickel may be used. Also, a conductive polymer particle or a particle of a superconducting member can be used.

It is preferable that the diameter of the conductive particle be 5 nm to 0.1 µm. If the diameter of the conductive particle is larger than 0.1 µm, it is difficult to eject the liquid member according to liquid drop ejecting method because clogging often may occur in the nozzle of a head in the liquid drop ejecting device which is explained later. Also, if the diameter of the conductive particle is smaller than 5 nm, a volume ratio of a coating member to the conductive particle becomes high, and thus, a ratio of the organic member in the obtained layer becomes excessive.

It is preferable that, in a liquid dispersion medium containing the conductive particle, a steam pressure in a room temperature be 0.001 mmHg to 200 mmHg (approximately 0.133 Pa to 26600 Pa). If the steam pressure is higher than 200 mmHg, the dispersion medium evaporates rapidly after the ejection; thus, it is difficult to form a superior layer.

Also, it is more preferable that the steam pressure in the dispersion medium be 0.001 mmHg to 50 mmHg (approximately 0.133 Pa to 6650 Pa). If the steam pressure is higher than 50 mmHg, clogging easily occurs in the nozzle when the liquid drop is ejected according to the liquid drop ejecting method easily due to dryness; thus, it is difficult to perform a stable ejecting operation.

On the other hand, if the vapor pressure of the dispersion medium at room temperature is lower than 0.001 mmHg, the dispersion medium remains in the layer easily because it takes time for dehydration to occur; thus, it is difficult to obtain a superior conductive layer in a thermal process or an optical process.

There is no particular limitation for the dispersion medium as long as the dispersion medium can disperse the conductive particles and does not cause clumping. More specifically, water; alcohols such as methanol, ethanol, propanol, and butanol; hydrocarbons such as n-heptane, n-octane, decane, toluene, xylene, cymene, durene, indene, dipentene, tetrahydronaphthalene, decahydronaphthalene, and cyclohexylbenzene; ethers such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-ethoxyethyl) ether, p-dioxane; and polar compounds such as propylene carbonate, γ-butyrolactone, N-methyl-2-pyrrolidone, dimethylformamide, dimethylsulfoxide, and cyclohexanone hydrocarbons, ethers can be named. Among these dispersion media of water, alcohols, hydrocarbons, ethers are preferable in that the particles disperse easily, the dispersion liquid is stable, and these dispersion media can be used easily in the liquid drop ejecting method. As further preferable dispersion media, it is possible to name water and hydrocarbons. These dispersion media can be used independently or in combination with other dispersion media as a mixture.

When the above conductive particles are dispersed in the dispersion medium, it is preferable that the dispersion density be 1 weight % to 80 weight %. By doing this, it is possible to adjust the dispersion density according to the thickness of the conductive layer. If the dispersion density is greater than 80 weight %, aggregation easily occurs; thus, it is difficult to form a uniform layer.

It is preferable that surface tension of the dispersion liquid (liquid member) in which the above conductive particle is dispersed be 0.02 N/m to 0.07 N/m. When the liquid member is ejected by the liquid drop ejecting method, if the surface tension is lower than 0.02 N/m, wettability of the ink composite on a nozzle surface increases; thus, a flying curve may occur easily. If the surface tension is greater than 0.07 N/m, the shape of a maniscus on the nozzle tip is unstable; thus, it is difficult to control the ejection amount and ejection timing.

In order to adjust the surface tension, it is possible to add a small amount of surface tension adjuster of the fluorine type, silicone type, nonionic type, or the like to the dispersion liquid as long as the contact angle with the base board S does not decrease unreasonably. A nonionic surface tension adjuster improves the wettability of the liquid member to the base board and leveling ability of the layer. A nonionic surface tension adjuster is useful for preventing bubbles in the formed layer and orange peel finish.

It is acceptable that the dispersion liquid contain an organic compound such as an alcohol, an ether, an ester, and a ketone according to necessity.

It is preferable that viscosity of the dispersion liquid be 1 mPa·s to 50 mPa·s. When the liquid drop is ejected by the liquid drop ejecting method, when the visousity is lower than 1 mPa·s, a periphery of the nozzle may be contaminated by the ink. If the viscosity is higher than 50 mPa·s, the nozzle hole is often clogged; thus it is difficult to eject the liquid drop smoothly.

The controlling section 40 has a function of a computer and the like. The controlling section 40 controls the inclination angle of the liquid drop ejecting head 34 and ejection amount of the liquid drop from nozzles N. Also, data are put in the controlling section 40 in advance. By doing this, a plurality of unit areas are set in a lattice manner on the base board S, and the main nozzle Na ejects the liquid drops to the unit area. On the other hand, the liquid drop is ejected from the sub-nozzle Nb to the border section between the unit areas. Thus, the ejection operation from the liquid drop ejecting head 34 is controlled.

Plasma Display Device

Next, a wiring pattern forming method using the above layer forming apparatus 1 is explained as an example of a layer forming method according to the present invention. Here, as an example, a wiring pattern formed in a plasma display device is explained.

Figure 4:
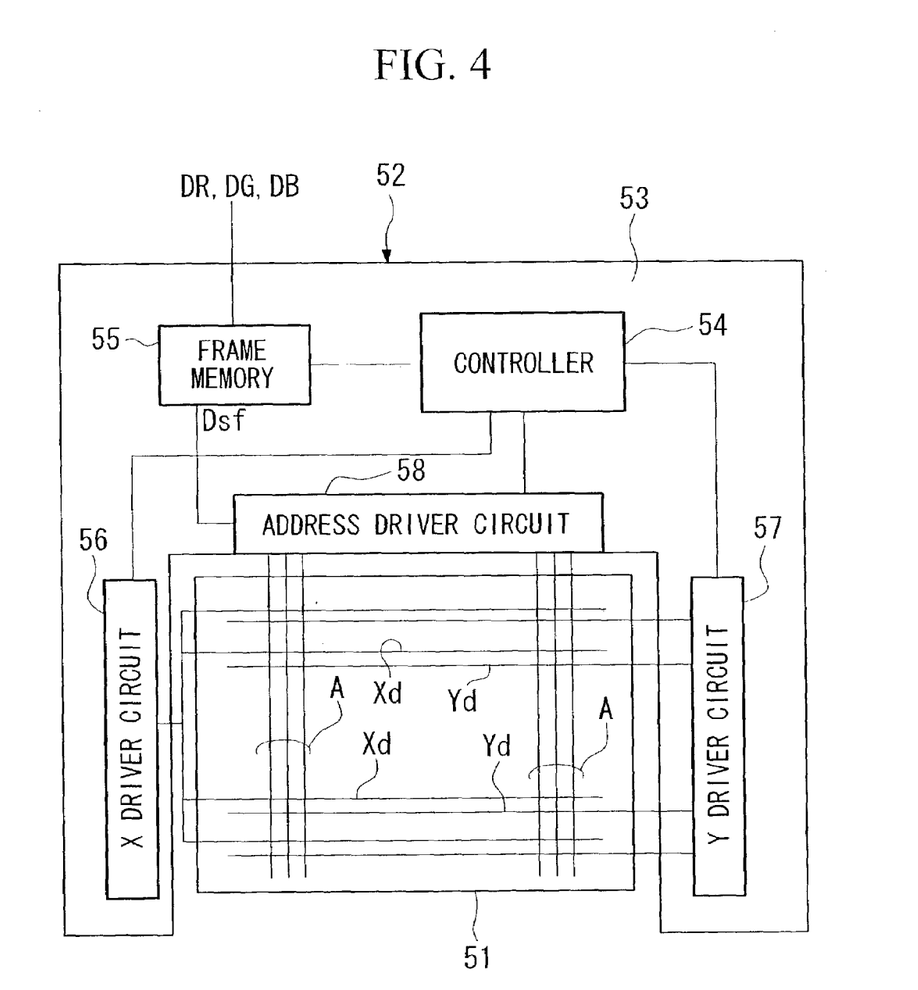
FIG. 4 is a block diagram for a plasma display device in which layer forming method of the present invention is employed.

FIG. 4 is a block diagram of a plasma display device in which a layer forming method according to the present invention is employed. Reference numeral 52 in FIG. 4 indicates a plasma display device. The plasma display device 52 is provided with an AC plasma display panel 51 as a matrix color display device and a driving unit 53 for illuminating numerous cells contained in the screen selectively.

The plasma display panel 51 is a surface discharge plasma display panel in which a pair of sustain electrodes Xd and Yd are disposed in parallel. In a three-electrode matrix, the sustain electrodes Xd and Yd, and an address electrode A correspond to each cell. The sustain electrodes Xd and Yd expand in a line direction (horizontal direction) in a screen. The sustain electrode Yd is used for a scan electrode for selecting a cell line by line so as to perform addressing operation. The address electrode A is a datum electrode for selecting a cell array by array. The address electrode A expands in an array direction (vertical direction). The driving unit 53 comprises a controller 54, a frame memory 55, an X driving circuit 56, Y driving circuit 57, an address driving circuit 58, and a power supplying circuit not shown in the drawing. Multilevel image data DR, DG, and DB which indicate illumination level (contrast level) of RGB in each pixel are put into the driving unit 53 together with various synchronized signals from an external device.

After the image data DR, DG, and DB are contained in the frame memory 55, the image data DR, DG, and DB are converted to sub-frame data Dsf per each color by the controller 54. Then, the image data DR, DG, and DB are contained again in the frame memory 55. The sub-frame data Dsf are collected data of binary data which indicates whether or not a cell should be illuminated in each sub-frame formed by dividing a frame so as to display the contrast. The X driving circuit 56 applies voltage to the sustain electrode Xd. The Y driving circuit 57 applies voltage to the sustain electrode Yd. The address driving circuit 58 applies addressing voltage selectively according to the sub-frame data Dsf which is transmitted from the frame memory 55.

Figure 5:
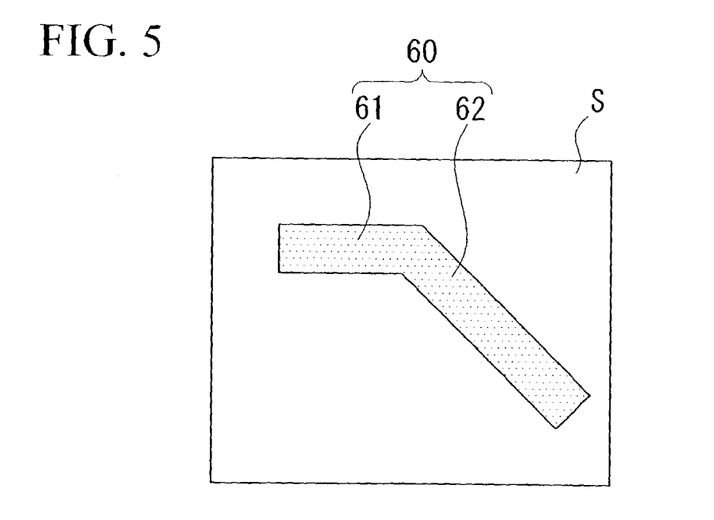
FIG. 5 shows an example of a wiring pattern.

FIG. 5 is an enlarged view of a part of a wiring pattern in the plasma display device shown in FIG. 4. In FIG. 5, a linear line pattern 61 which expands in the X-axis direction and an inclining line pattern 62 which is connected to the linear line pattern 61 and expands in an inclining direction to the expanding direction of the linear line pattern 61 are formed on the base board S. The inclining line pattern 62 is a leading line for connecting the driving circuit shown in FIG. 4 and the sustain electrode. On the other hand, the linear line pattern 61 is, for example, a sustain electrode.

Processes for forming the wiring pattern 60 shown in FIG. 5 are explained as follows.

Figure 6A:
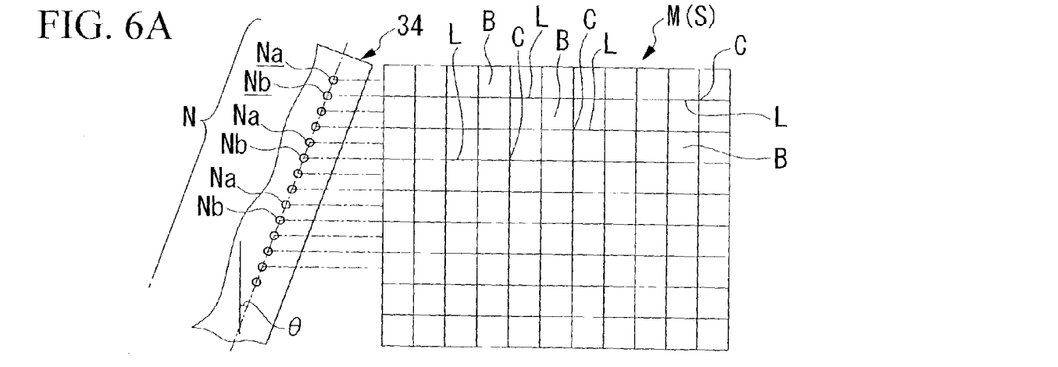
FIGS. 6A to 6C show processes for forming a wiring pattern shown in FIG. 5.

First, as shown in FIG. 6A, a bit map M, which is formed by a plurality of lattice bits (unit area) B, is set on the base board S. Also, the inclination angle of the liquid drop ejecting head 34 is controlled by the controlling section 40. As shown in FIG. 6A, the main nozzle Na of the liquid drop ejecting head 34 is disposed so as to correspond to centers of a plurality of bits B. By doing this, the sub-bit Nb which is disposed so as to correspond to a border section between the main bits Na such as a cross point C of lines L which form the bits B because the bits (unit areas) B are set in a square form.

Figure 6B:
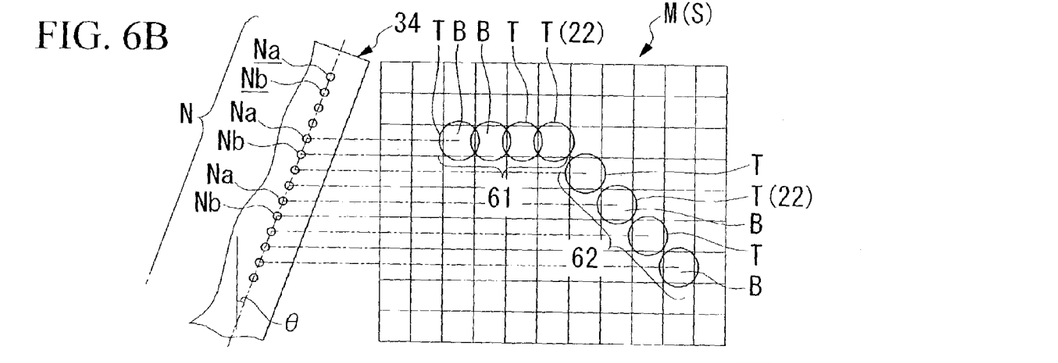

Next, positions to which the liquid drops are ejected in the bits B on the bit map M are set so as to correspond to dimensions and shapes of the wiring pattern 6. Consequently, the liquid drops 22 are ejected from the main nozzle Na of the liquid drop ejecting head 34 toward a center of the bit B. Thus, the liquid drop 22 settles in the bit B (unit area) as shown in FIG. 6B. Here, the ejected liquid drop 22 has the size (volume) such that the diameter of the settled liquid drop T is slightly larger than a length of a member of the bit B. That is, the ejected liquid drop 22 has the size (volume) such that a part of the periphery of the settled liquid drops T overlap between the bits B which neighbor in a vertical direction or horizontal direction.

By ejecting the liquid drop in the above way, the settled neighboring liquid drops T overlap in the bit B which forms the linear line pattern 61; thus, the settled neighboring liquid drops become continuous. However, the distance between the liquid drops T is equal to a length of a diagonal line in the dot B (unit area) in the bit B which forms the inclining line pattern 62 such as a space between bits B and B which are disposed to be inclined. Such a distance between the liquid drops T becomes 1.4 times as long as a member of the bit B. Therefore, the diagonally neighboring liquid drops T do not overlap continuously.

Figure 6C:
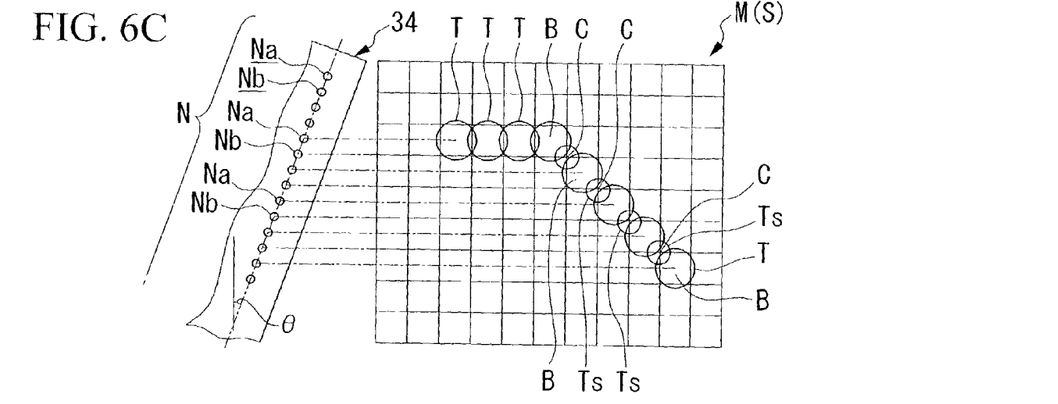

Therefore, the liquid drop is ejected from the main nozzle Na of the liquid drop ejecting head 34 in the bit B which forms the inclining line pattern 62. After that, as shown in FIG. 6C, the liquid drop Ts is ejected from the sub-nozzle Nb so as to be settled on a border section between bits B and B which are disposed diagonally. Thus, the liquid drops Ts settle on a crossing point C of the lines L shown in FIG. 6C. In such a case, it is acceptable that the size (volume) of the liquid drop 22 which is ejected from the sub-nozzle Nb be equal to the size of the liquid drop (T) which is ejected from the main nozzle Na. In such a case, the quantity of the liquid member in the bit B which forms the inclining line pattern 62 is substantially larger than the quantity of the liquid member in the bit B which forms the linear line pattern 61. By doing this, line width of the inclining line pattern 62 is wider than that of the linear line pattern 61. Also, the thickness of the inclining line pattern 62 is thicker than that of the linear line pattern 61.

Therefore, the ejection waveform of the liquid drop (Ts) which is ejected from the sub-nozzle Nb is controlled by the controlling section 40 in advance. By doing this, the liquid drop (Ts) is made sufficiently smaller than the liquid drop (T) which is ejected from the main nozzle Na. For example, it is preferable that the size of the liquid drop (Ts) which is ejected from the sub-nozzle Nb be controlled such that the amount of liquid drop overlapping between the liquid drop T which is ejected from the main nozzle Na in the inclining line pattern 62 be approximately equal to the amount of the liquid drops between T and T which form the linear line pattern 61.

After the linear line pattern 61 and the inclining line pattern 62 are formed by the liquid drops T and Ts in this way, the liquid component in the liquid drops (liquid member) is evaporated by performing a dehydrating operation. Thus, the conductive particles remain on the base board S. Furthermore, the conductive particles are sintered by performing a baking operation; thus, the wiring pattern 60 formed by the continuous linear line pattern 61 and the inclining line pattern 62 shown in FIG. 5 is obtained.

In the wiring pattern 60 formed in the above method, the liquid drops which are ejected from the main nozzle Na settle in the diagonal bits B in the inclining line pattern. Simultaneously, the liquid drop which is ejected from the sub-nozzle Nb settles on the border section between the bits B and B, such as a crossing point C on lines L. Therefore, there is no place where the liquid drops are not continuous between liquid drops T and T; thus, the liquid drops reliably become continuous. Therefore, it is possible to realize a reliable wiring pattern 60 because disconnection of the line does not occur not only in the linear line pattern 61 but also in the inclining line pattern 62.

Also, according to the manufacturing method for the above wiring pattern 60, it is possible to form a superior wiring pattern 60. Furthermore, the main nozzle corresponds to each bit B. The sub-nozzle Nb corresponds to the border section between bits B and B. Therefore, it is possible to eject the liquid drop to the bit B without moving the liquid drop ejecting head 34 in the X-axis direction shown in FIG. 1 similarly to the conventional case. Also, it is possible to eject the liquid drop to the border section between the bits B and B without moving the liquid drop ejecting head 34 in the X-axis direction. Therefore, it is possible to shorten the time which is necessary for ejecting the liquid drop by setting the scanning speed at high speed. Also, it is possible to enhance the ejection accuracy. By doing this, it is possible to form highly accurate and reliable wiring pattern 60 efficiently in a short time.

Also, the device (a plasma display device in the present embodiment) having such a wiring pattern 60 has a reliable superior wiring pattern 60; thus, the device is reliable.

Here, the ejection operation of the liquid drop from the liquid drop ejecting head 34 is not limited to a case in which the liquid drop is ejected from the sub-nozzle Nb after the liquid drop is ejected from the main nozzle Na as explained above. It is acceptable that the liquid drop be ejected from the main nozzle Na after the liquid drop be ejected from the sub-nozzle Nb. Furthermore, it is acceptable that the liquid drop be ejected from the main nozzle Na and the sub-nozzle Nb simultaneously.

Also, it is acceptable that the liquid drop be ejected to one point a plurality of times from the main nozzle Na and the sub-nozzle Nb so as to layer the liquid drops for a purpose of realizing a preferable thickness of the liquid drops. In such a case, it is acceptable for arranging a baking process between the ejection operations according to necessity.

Also, in the above embodiment, nozzles which are disposed so as to have one sub-nozzle Nb therebetween are called main nozzles Na. Also, the sub-nozzles are disposed so as to have one main nozzle Na therebetween. However, the present invention is not limited to such an arrangement. In the present invention, it is acceptable that nozzles which are disposed so as to have two or three sub-nozzles Nb therebetween are called main nozzles Na. In such a case, it is necessary to increase the inclination angle θ of the liquid drop ejecting head 34 such that the main nozzle Na corresponds to the bit B. Here, the sub-nozzle Nb increases; thus, it is possible to more flexibly eject the liquid drops to a position which does not correspond to the bit B. By doing this, it is possible to form the patterns more flexibly.

Also, it is acceptable that the inclination angle θ of the liquid drop ejecting head 34 be changed per each scanning operation according to the pattern to be formed, and to change the number of the sub-nozzles Nb which are disposed between the main nozzles Na preferably.

Also, in the above case, the layer which is formed according to the present invention is a wiring pattern. However, the present invention is not limited to such features. The present invention can be used for all layers which are formed on devices such as a semiconductor device. For such a device, it is possible to name, for example, an insulating layer, a protecting layer, a color filter, an illuminating member, and the like.

Next, other examples for the layer forming method according to the present invention are explained.

In the above embodiment, the main nozzle Na is disposed so as to correspond to the center of the bit B by controlling the inclination angle θ of the liquid drop ejecting head 34. In contrast, in the present invention, the wiring pattern is formed without controlling the inclination angle θ.

In the present embodiment, the same reference numerals are added to the same members as members in the above embodiments; thus, explanations are made only for features which are different from the features in the above embodiment so as to omit duplicated explanations.

Figure 7A:
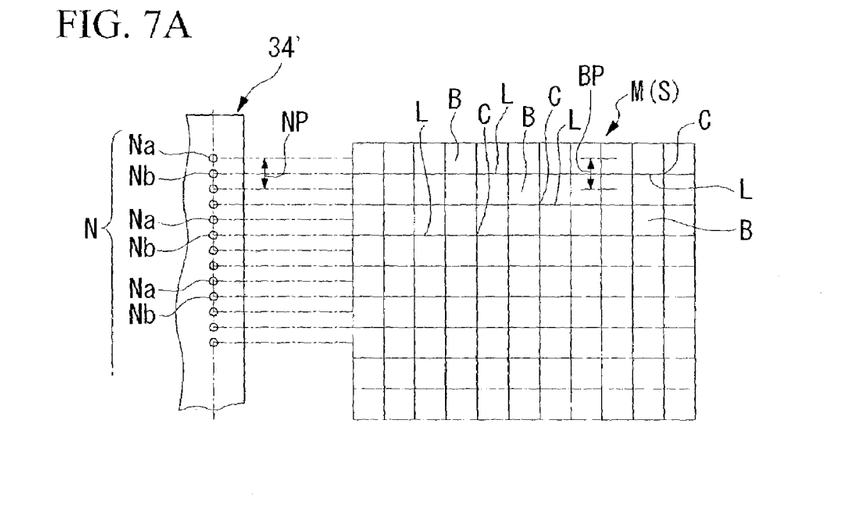
FIGS. 7A and 7B show processes for showing forming processes in another layer forming method according to the present invention.

In the present embodiment, a liquid drop ejecting head 34' which has different structure from that of the above liquid drop ejecting head 34. The liquid drop ejecting head 34' is provided with a nozzle N in which a center distance (distance between centers of neighboring unit areas) BP between the bits B and B and a pitch width of the main nozzle Na are equal as shown in FIG. 7A. That is, the liquid drop ejecting head 34' is used for ejecting the liquid member in a specific center distance BP exclusively. Here, the sub-nozzle Nb corresponds to the border section between the bits B and B such as a crossing point of lines L.

Figure 7B:
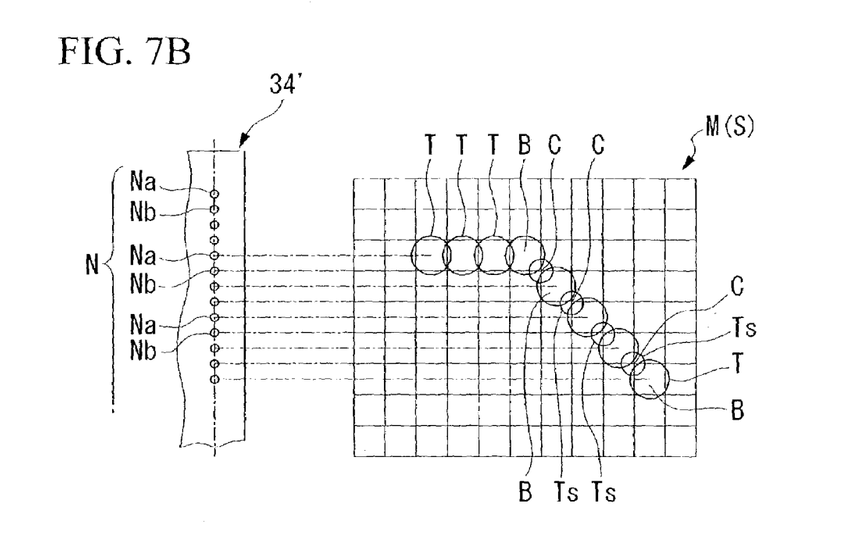

According to the layer forming method which employs the liquid drop ejecting head 34' having the above structure, it is not necessary to control the inclination angle θ and the liquid drop T and the liquid drop Ts settle on the base board S as shown in FIG. 7B. Therefore, it is possible to form the wiring pattern 60 (see FIG. 5) similarly to the above embodiment.

Also, it is not necessary to control the inclination angle θ. Therefore, it is not necessary to dispose a motor 44 in the attaching section 43 in the layer forming apparatus 30. Therefore, it is possible to reduce the cost of the layer forming apparatus 30. Simultaneously, it is possible to perform the layer-forming operation with high precision without deteriorating the ejection accuracy which depends on the inclination angle θ.

In the present embodiment, the layer forming method for the wiring pattern 60 is explained. However, the present invention is not limited to a case in which the wiring pattern 60 is manufactured, and it is possible to form a layer according to various patterns. For example, when the center distance BP is relatively large, that is, when the bit map M is coarse, the liquid drop ejecting head which is provided with the main nozzle Na having large pitch width NP is used according to the center distance BP.

Also, in the present embodiment, the pitch width NP is set to be equal to the center distance BP. However, in the present invention, it is acceptable that the pitch width NP corresponds to the center distance BP. That is, it is acceptable that the pitch width NP be, for example, half a length of the center distance BP. In such a case, the liquid drop T settles on the bit B by moving the stage 39 in the layer forming apparatus 30 and the liquid drop ejecting head 34 relatively in a preferred manner.

Liquid Crystal Display Apparatus

Next, a liquid crystal display apparatus is explained as a device to which the manufacturing method according to the present invention is applied. Here, the manufacturing method for the liquid crystal display apparatus in the present embodiment is approximately the same as the wiring-pattern forming method which is described above; therefore, repeated explanations are omitted.

Figure 8A:
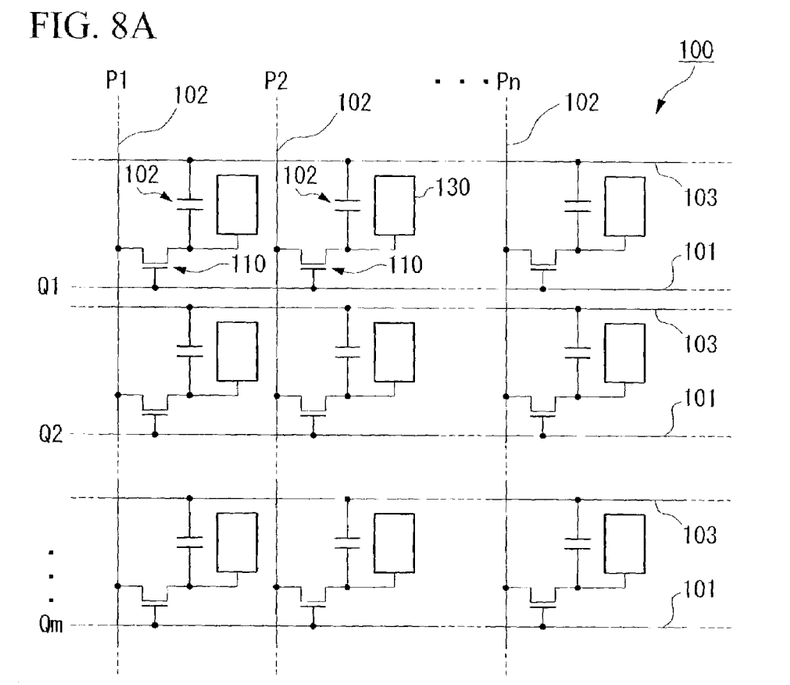
FIG. 8A shows an equivalent circuit in an image display area.
Figure 8B:
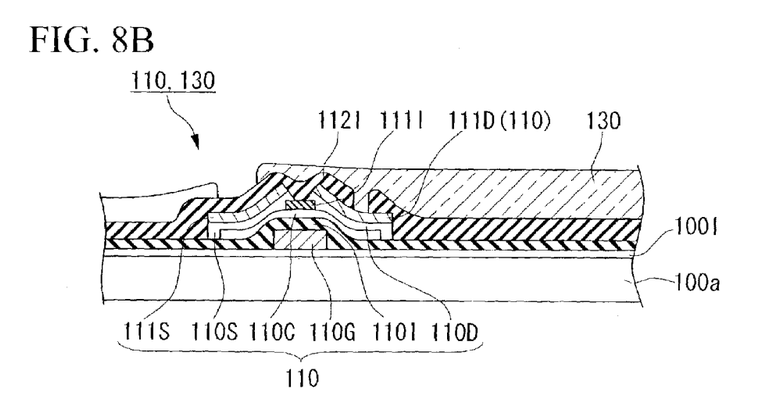
FIG. 8B is an enlarged view for showing a general structure of each pixel.

FIGS. 8A and 8B show liquid crystal display apparatuses. FIG. 8A shows an equivalent circuit such as elements and wirings for a switching element which forms an image display area in a liquid crystal display apparatus. FIG. 8B is an enlarged view for an important part of the liquid crystal display apparatus so as to explain a structure of the switching element which is provided in each pixel and a pixel electrode.

As shown in FIG. 8A, in the liquid crystal display device 100, a plurality of scanning lines 101 and a plurality of data lines 102 which are disposed in a matrix, a plurality of pixel electrodes 130, and a plurality of pixel switching TFTs 110 (hereinafter called TFTs) for controlling the pixel electrodes 130, are formed. Scanning signals Q1, Q2, to Qm are supplied in the scanning line 101 in a pulsed manner. Image signals P1, P2, to Pn are supplied in the data line 102. Furthermore, the scanning line 101 and the data line 102 are connected with the TFT 110 as explained later. The TFT 110 is driven by the scanning signals Q1, Q2, . . . Qm and the image signals P1, P2, . . . Pn. Furthermore, an accumulating capacity 120 is formed for retaining the image signals P1, P2, to Pn having a predetermined level for a certain period. A capacity line 103 is connected to the accumulating capacity 120.

Next, the structure of the TFT 110 is explained with reference to FIG. 8B.

As shown in FIG. 8B, the TFT 110 is a so called bottom gate TFT (reverse stagger bottom gate). More specifically, an insulating base board 100a which becomes a base member for a liquid crystal display apparatus 100, a base protecting layer 100I which is formed on a surface of the insulating base board 100a, a gate electrode 110G, a gate insulating layer 110I, a channel area 110C, and an insulating layer 112I for protecting the channel are stacked in this order. A source area 110S which is a high density N-amorphous silicon layer and a drain area 110D are formed on both sides of the insulating layer 112I. A source electrode 111s is formed on a surface of the source area 110S. A drain electrode 111D is formed on a surface of the drain area 110D.

Furthermore, an interlayer insulating layer 112I and a pixel electrode 130 which is made from a transparent electrode such as an ITO member are formed on surfaces of the above electrodes. The pixel electrode 130 is connected to the drain electrode 110D electrically via a contact hole of the interlayer insulating layer 130.

Here, the gate electrode 110G is a part of the scanning line 101. Furthermore, the source electrode 111S is a part of the data line 102. Furthermore, the gate electrode 110G and the scanning line 101 are formed according to the wiring-pattern forming method which is explained above.

In such a liquid crystal display apparatus, electricity is supplied from the scanning line 101 to the gate electrode 110g according to the scanning signals Q1, Q2, to Qm. An electric field is generated near the gate electrode 110g; thus, the channel area 110C is under conductive condition by such an electric field. Furthermore, under such conductive conditions, electricity is supplied from the data line 102 to the source electrode 111S according to the image signals P1, P2, . . . Pn; thus, the electricity reaches the pixel electrode 130 and voltage is applied between the pixel electrode 130 and the facing electrodes. That is, it is possible to drive the liquid crystal display apparatus preferably by controlling the scanning signals Q1, Q2, . . . Qm and the image signals P1, P2, . . . Pn.

The gate electrode 110G and the scanning line 101 are formed according to the above wiring pattern forming method in the liquid crystal display apparatus having the above structure. Therefore, the wiring pattern has no defects such as discontinuities; therefore, the wiring pattern is superior and reliable. Therefore, the liquid crystal display apparatus is reliable. That is, there is the same effect as the effect which is explained above.

Here, the wiring pattern forming method according to the present embodiment is not limited to a case in which the gate electrode 110G and the scanning line 101 are formed. The wiring pattern forming method according to the present embodiment can be employed in methods for forming other wirings such as a data line 102 and the like.

Field Emission Display Apparatus

Next, a field emission display apparatus (hereinafter called an FED) which is provided with an electric field emission element is explained as a device to which the manufacturing method according to the present invention is applied. Here, the manufacturing method for the FED is the same as the manufacturing method for the above wiring pattern; thus, explanation for the manufacturing method of the FED is omitted.

Figure 9A:
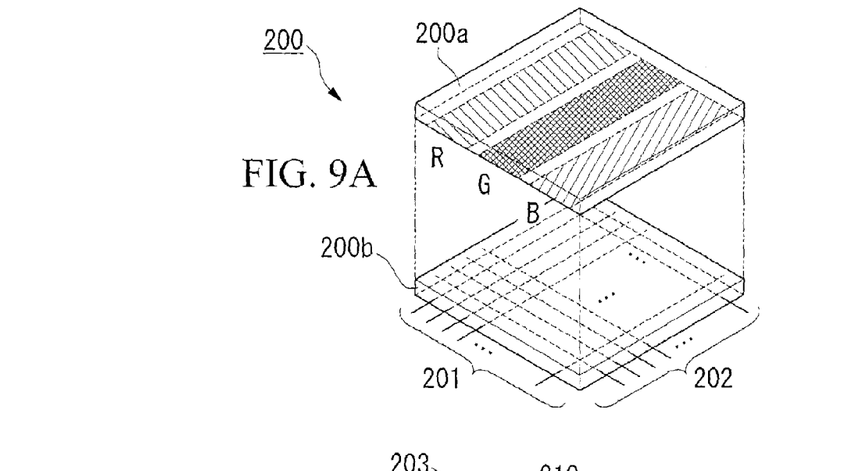
FIG. 9A is a general view of the electron discharging display.
Figure 9B:
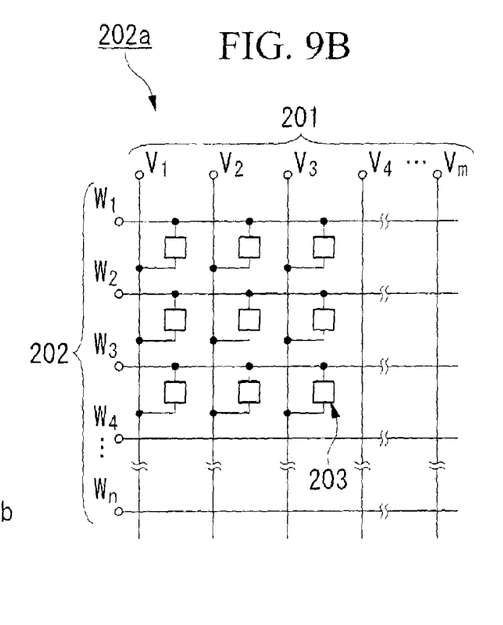
FIG. 9B shows a driving circuit.
Figure 9C:
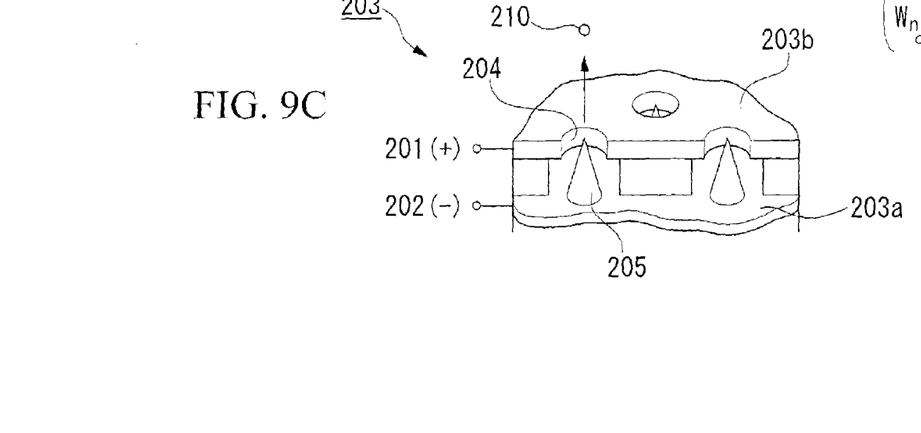
FIG. 9C is a perspective view for showing an important part of the electron discharging device.

FIGS. 9A to 9C are drawings for explaining the FED. In FIG. 9A, a general structure for showing a disposition of a cathode base board and an anode base board which form the FED is shown. FIG. 9B is a diagram for a driving circuit which is provided in the cathode base board in the FED. FIG. 9C is a perspective view showing an important part of the cathode base board.

As shown in FIG. 9A, in a FED 200, a cathode base board 200a and an anode base board 200b are disposed so as to face each other. As shown in FIG. 9B, the cathode base board 200a comprises a gate line 201, an emitter line 202, and an electric field emission element 203 which is connected to the gate line 201 and the emitter line 202. That is, the FED 200 is a simple matrix driving circuit. Gate signals V1, V2, . . . Vm are supplied in the gate line 201. Emitter signals W1, W2, . . . Wm are supplied in the emitter line 202. Also, the anode base board 200b is provided with a fluorescent member having RGB colors. Such a fluorescent member illuminates when an electron impinges thereon.

As shown in FIG. 9C, the electric field emission element 203 is provided with an emitter electrode 203a which is connected to the emitter line 202 and a gate electrode 203b which is connected to the gate line 201. Furthermore, the emitter electrode 203a is provided with a protruding section which is called an emitter tip 205 in which the tip is narrowing toward the gate electrode 203b from the emitter electrode 203a. In the emitter electrode 203a, a hole section 204 is formed on the gate electrode 2031b which is disposed so as to correspond to the emitter tip 205. The tip of the emitter tip 205 is disposed in the hole section 204.

In such an FED 200, the gate signals V1, V2 . . . Vm in the gate line 201 and the emitter signals W1, W2 . . . Wm in the emitter line 202 are controlled. By doing this, voltage is supplied between the emitter electrode 203a and the gate electrode 203b. An electron 210 moves from the emitter tip 205 toward the hole section 204 due to an electrolysis; thus, the electron 210 is discharged from the tip of the emitter tip 205. Here, the electron 210 and the fluorescent member in the anode base board 200b contact; thus, the fluorescent member illuminates and it is possible to drive the FED 200 as desired.

The emitter electrode 203a and the emitter line 202 are formed according to the above wiring pattern forming method in the FED having the above structure. Therefore, the wiring pattern has no defects such as discontinuities; therefore, the wiring pattern is superior and reliable. Therefore, the liquid crystal display apparatus is reliable. That is, there is the same effect as the effect which is explained above.

Here, the wiring pattern forming method according to the present embodiment is not limited to a case in which the emitter electrode 203a and the emitter line 202 are formed. The wiring pattern forming method according to the present embodiment can be employed in methods for forming other wirings such as a gate line 203b, a gate line 201 and the like.

Here, a device according to the present invention can be other devices having wiring patterns. For example, a device according to the present invention can reliably be used for manufacturing wiring patterns which are formed for an organic electro-luminescence apparatus or an electrophoresis apparatus.

Next, an example of an electronic apparatus which is provided with a display device (for example, the above plasma display apparatus) to which the above manufacturing method is applied, is explained.

Figure 10A:
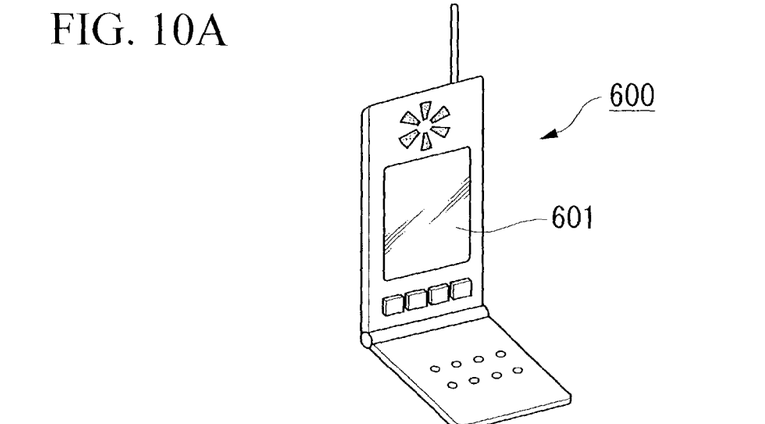
FIG. 10A is a perspective view of an example of the present invention which is employed in a mobile phone.

FIG. 10A is a perspective view for an example of a mobile phone. In FIG. 10A, reference numeral 600 indicates a mobile phone unit. Reference numeral 601 indicates a display section using the above display apparatus.

Figure 10B:
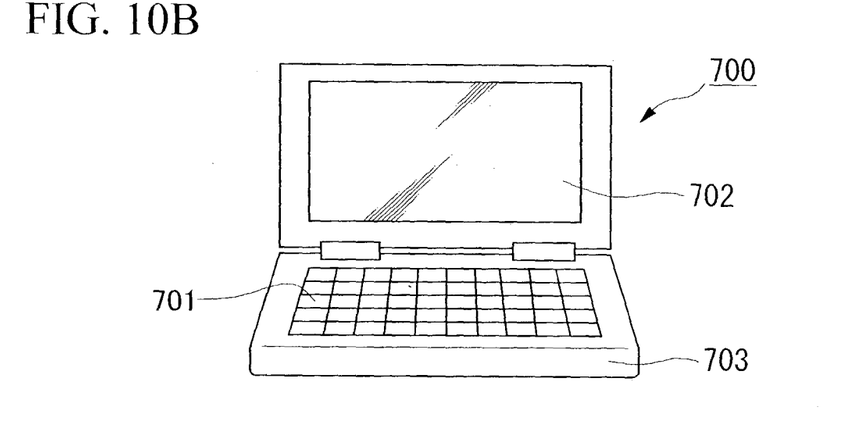
FIG. 10B is a perspective view of an example of the present invention which is employed in an information processing apparatus.

FIG. 10B is a perspective view showing an example of a mobile information processing apparatus such as a word processor and a personal computer. In FIG. 10B, reference numeral 700 indicates an information processing apparatus. Reference numeral 701 indicates an input section such as a keyboard. Reference numeral 702 indicates a display section using the above display apparatus. Reference numeral 703 indicates an information processing apparatus unit.

Figure 10C:
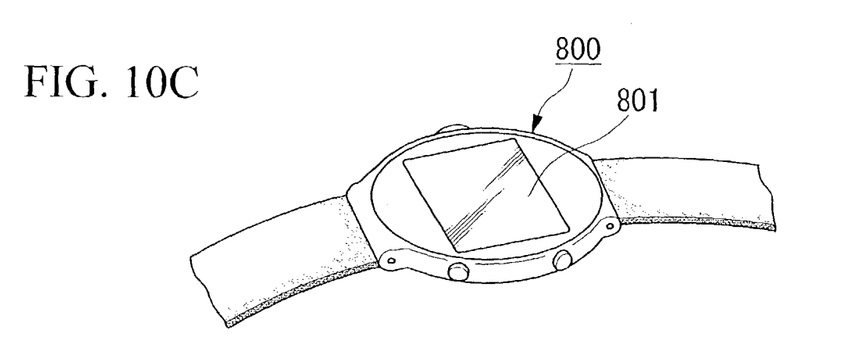
FIG. 10C is a perspective view of an example of the present invention which is employed in an electronic watch apparatus.

FIG. 10C is a perspective view showing an example for a electronic watch apparatus. In FIG. 10C, reference numeral 800 indicates a watch unit. Reference numeral 801 indicates a display section using the above display apparatus.

The electronic apparatuses shown in FIGS. 10A to 10C are provided with the above display apparatuses; thus, the electronic apparatuses have superior device quality.

What is claimed is:

1. A method for forming a predetermined wiring pattern on a base board by ejecting a liquid drop from a liquid drop ejecting head onto a plurality of unit areas formed on the base board, the liquid drop being made from conductive particles dispersed in a dispersion medium, the method comprising:

forming a first pattern by a first nozzle group formed in the liquid drop ejecting head;

forming a second pattern by a second nozzle group formed in the liquid drop ejecting head which is different from the first nozzle group; and dehydrating the ejected liquid drop, wherein the liquid drop is ejected to the unit area by the first nozzle group, and the liquid drop is ejected to a border section between unit areas by the second nozzle group, and wherein the first pattern corresponds to a linear line pattern expanding in an X-axis direction and corresponds to unit areas of an inclining line pattern connected to the linear line pattern and expanding in an inclining direction to the expanding direction of the linear pattern, the second pattern corresponding to the border section between the unit areas of the inclining line pattern, so that the first and second pattern are formed on the base board.

2. A layer forming method according to claim 1 wherein, the first nozzle group and the second nozzle group are disposed in an equal interval vertically in the liquid drop ejecting head in a nozzle array; and the second nozzle group is disposed to have the first nozzle group therebetween in the nozzle array.

3. A layer forming method according to claim 1 wherein an interval between the first nozzle group and the second nozzle group is determined according to an interval between the unit areas in the liquid drop ejecting head.

4. A layer forming method according to claim 1 wherein surface tension of a dispersion medium in which a conductive particle is dispersed is in a range of 0.02 N/m to 0.07 N/m.

5. A layer forming method according to claim 1 wherein a viscosity of a dispersion medium is in a range of 1 mPa·s to 50 mPA·s.

6. The layer forming method according to claim 1, wherein the conductive particles are dispersed in the dispersion medium such that a dispersion density is in a range of 1 weight % to 80 weight %.

7. A method for manufacturing a device having a predetermined wiring pattern on a base board by ejecting a liquid drop from a liquid drop ejecting head onto a plurality of unit areas formed on the base board, the liquid drop being made from conductive particles dispersed in a dispersion medium, the method comprising:

forming a first pattern by a first nozzle group formed in the liquid drop ejecting head;

forming a second pattern by a second nozzle group which is different from the first nozzle group; and dehydrating the ejected liquid drop, wherein the liquid drop is ejected to the unit area by the first nozzle group, and the liquid drop is ejected to a border section between unit areas by the second nozzle group, and wherein the first pattern corresponds to a linear line pattern expanding in an X-axis direction and corresponds to unit areas of an inclining line pattern connected to the linear line pattern and expanding in an inclining direction to the expanding direction of the linear line pattern, the second pattern corresponding to the border section between the unit areas of the inclining line pattern, so that the first and second pattern are formed on the base board.

8. The manufacturing method according to claim 7, wherein the conductive particles are dispersed in the dispersion medium such that a dispersion density is in a range of 1 weight % to 80 weight %.

* * * * *